(12) United States Patent
Adachi et al.

(10) Patent No.: US 6,255,739 B1
(45) Date of Patent: Jul. 3, 2001

(54) SEMICONDUCTOR DEVICE

(75) Inventors: Masaki Adachi, Yokohama; Megumi Yamamura, Ibo-gun, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/451,755

(22) Filed: Dec. 1, 1999

(30) Foreign Application Priority Data

Dec. 2, 1998 (JP) ................................... 10-342715
Sep. 7, 1999 (JP) ................................... 11-253210

(51) Int. Cl.$^7$ ................................................. H01L 23/29
(52) U.S. Cl. ..................... 257/788; 257/787; 257/789; 257/794; 257/795
(58) Field of Search ..................... 257/787, 788, 257/789, 795, 794

(56) References Cited

U.S. PATENT DOCUMENTS

| | | | |
|---|---|---|---|
| 4,632,798 | 12/1986 | Eickman et al. | |
| 4,720,424 | * 1/1988 | Eickman et al. | 428/323 |
| 4,933,744 | * 6/1990 | Segawa et al. | 357/72 |
| 5,097,317 | * 3/1992 | Fujimoto et al. | 357/72 |
| 5,324,888 | * 6/1994 | Tyler et al. | 174/52.2 |
| 5,629,566 | * 5/1997 | Doi et al. | 257/789 |
| 6,057,381 | * 5/2000 | Ma et al. | 522/99 |

FOREIGN PATENT DOCUMENTS

| | | |
|---|---|---|
| 0 44 136 | 1/1982 | (EP) . |
| 0 484 157 | 5/1992 | (EP) . |
| 1 526 159 | 9/1978 | (GB) . |
| 6-252283 | 9/1994 | (JP) . |
| 7-48522 | 2/1995 | (JP) . |
| 8-78561 | 3/1996 | (JP) . |
| 10-204256 | 8/1998 | (JP) . |

* cited by examiner

Primary Examiner—Tom Thomas
Assistant Examiner—Nitin Parekh
(74) Attorney, Agent, or Firm—Finnegan, Henderson, Farabow, Garrett & Dunner, L.L.P.

(57) ABSTRACT

A composition for sealing a semiconductor device contains polyphenylene sulfide wherein a line expansion coefficient at 150° C. to 200° C. is $4.75 \times 10^{-5}$ [1/°C.] or less, a line thermal expansion coefficient at 80 to 130° C. is $6.0 \times 10^{-5}$ [1/°C.] or less, and a line expansion coefficient ratio between the flow direction and a normal direction of the flow direction is 0.55 or more.

24 Claims, 3 Drawing Sheets

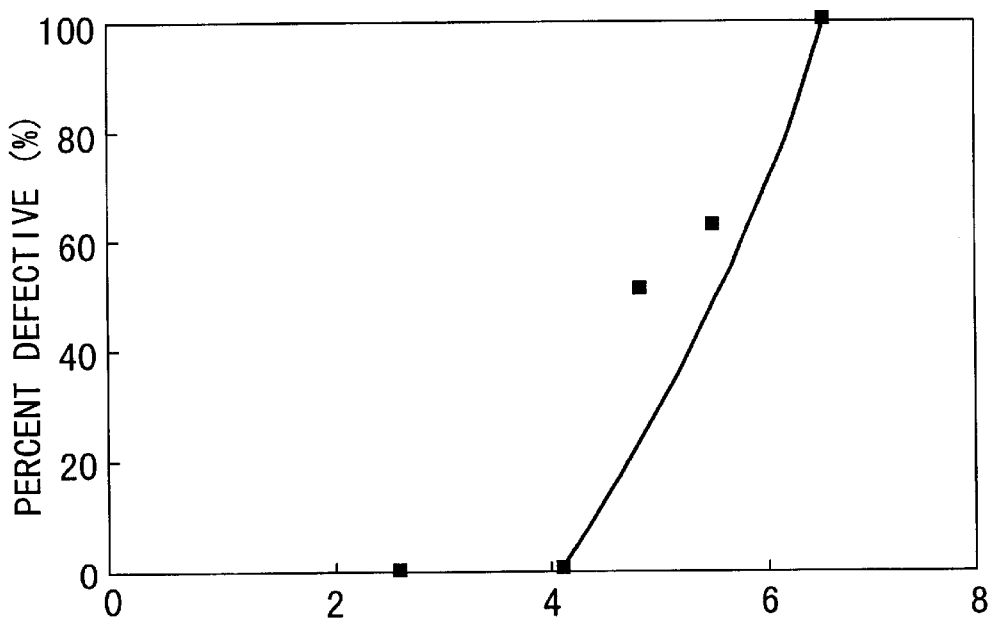
FIG. 3  LINEAR THERMAL EXPANSION COEFFICIENT $(\times 10^{-5} 1/°C)$
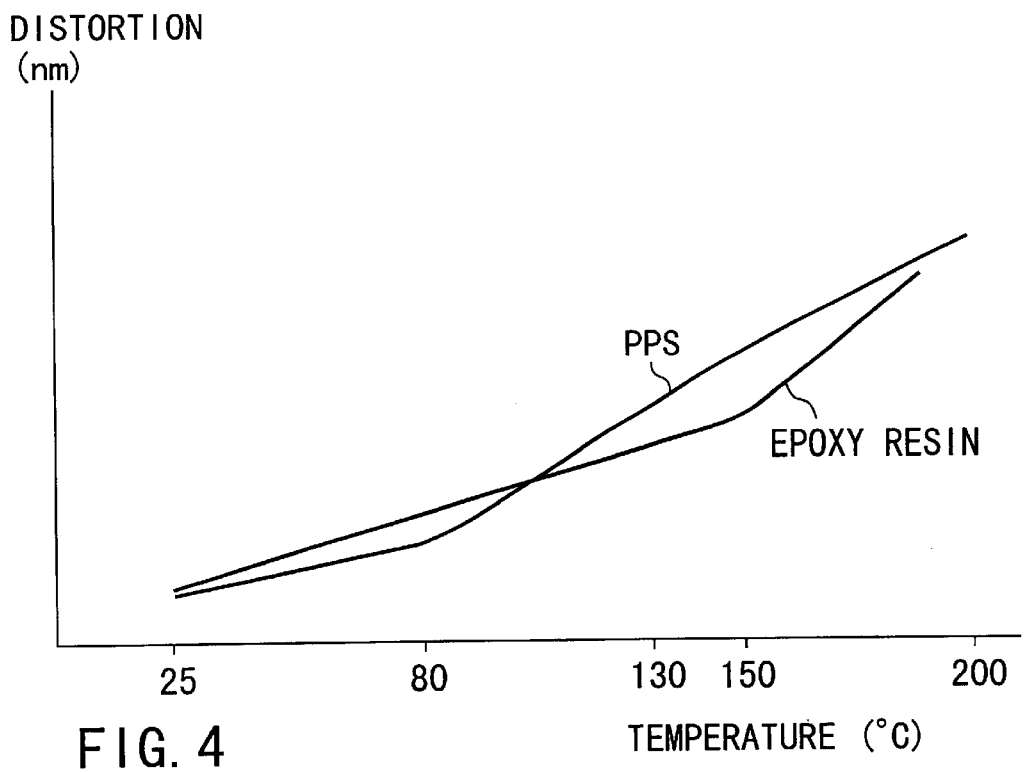
FIG. 4

SEMICONDUCTOR DEVICE

BACKGROUND OF THE INVENTION

The present invention relates to a semiconductor device having a semiconductor element sealed with a resin, and more specifically, to a semiconductor device having a highly recyclable package. The present invention further relates to a thermoplastic resin composition excellent in adhesiveness to a carrier member such as a leadframe.

Conventionally, it is known that a semiconductor device is formed by mounting a semiconductor element on a leadframe and thereafter sealing the semiconductor element with a thermosetting resin. Such a semiconductor device is formed as follows.

A leadframe having a semiconductor element mounted thereon is placed in a cavity formed by combining an upper mold and a lower mold. The semiconductor element is electrically connected to the leadframe by, for example, a bonding wire. Then, an epoxy resin (thermosetting resin) is injected through an injection port (gate) facing within the cavity. The epoxy resin thus injected is heated to solidify, with the result that the semiconductor element and the leadframe are integrated into one body. As described, the thermosetting resin is widely employed in manufacturing the semiconductor device since the thermosetting resin has a good flowability and adhesiveness.

However, when the thermosetting resin is cured, nearly 60 seconds in average is required until a curing reaction is completed. Due to the long reaction, the semiconductor device decreases in productivity. In addition, since the flowability of the thermosetting resin is too high, burrs are easily produced. Furthermore, once the thermosetting resin is heated, original flowability cannot be brought back. Therefore, the thermosetting resin cannot be recycled. Consequently, when the semiconductor devices using the thermosetting resin become out of use, they have no choice but to be subjected to the land-fill disposal or incineration disposal.

To reduce the curing time, it is considered to use a thermoplastic resin in place of the thermosetting resin. When the thermoplastic resin is used, it is estimated to take 10 seconds for curing. If the thermoplastic resin is used, the original flowability of the thermoplastic resin can be brought back by heat treatment. The thermoplastic resin is therefore advantageous in view of the recycle use.

However, compared to the thermosetting resin, the thermoplastic resin has low adhesion properties to the leadframe, so that moisture contents and oily contents may enter through an interface between the leadframe and the resin. Since the thermoplastic resin has a problem of low moisture resistance, it has not conventionally been used.

In addition, the thermoplastic resin has a large linear expansion coefficient, so that stress is applied to the semiconductor element after solidification. As a result, cracks are produced in the semiconductor element.

BRIEF SUMMARY OF THE INVENTION

An object of the present invention is to provide a highly reliable thermoplastic resin composition having high adhesion properties to a leadframe and a semiconductor element and generating no cracks in the semiconductor element.

According to the present invention, there is provided a resin composition containing a thermoplastic resin as a main component and having a line expansion coefficient of $4.75 \times 10^{-5}$ [1/°C.] or less at a temperature of 150° C. to 200° C. and a line expansion coefficient of $6.0 \times 10^{-5}$ [1/°C.] or less at 80–200° C.

According to the present invention, there is provided a resin composition containing a thermoplastic resin as a main component, in which a line expansion coefficient ratio between a flow direction and a normal direction of the flow direction is 0.55 or more.

According to the present invention, there is provided a resin composition containing polyphenylene sulfide in which a line expansion coefficient at 150° C. to 200° C. is of $4.75 \times 10^{-5}$ [1/°C.] or less, a line thermal expansion coefficient at 80 to 130° C. is $6.0 \times 10^{-5}$ [1/°C.] or less, and a line expansion coefficient ratio after solidification between a flow direction and a normal direction of the flow direction is 0.55 or more.

According to the present invention, there is provided a semiconductor device and a method of manufacturing the semiconductor device which uses a thermoplastic resin composition to seal a semiconductor element and a lead frame, and has good properties equivalent to a semiconductor device formed of a thermosetting resin.

The semiconductor device has a semiconductor element, a semiconductor sealing resin composition for sealing the semiconductor element; and a conducting material electrically connected to the semiconductor element an end of which is sealed with the semiconductor sealing resin composition.

The method of manufacturing a semiconductor device comprises a step of electrically connecting a semiconductor element to a conducting material, and a step of sealing the semiconductor element with the semiconductor sealing resin composition.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a graph showing the thermal expansion coefficient of a thermoplastic resin versus the percent defective;

FIG. 4 is a graph showing the temperature versus the distortion with respect to thermoplastic resin PPS (polyphenylene sulfide) and an epoxy resin;

DETAILED DESCRIPTION OF THE INVENTION

Now, the present invention will be explained with reference with the accompanying drawings.

Figures 1A, 1B:
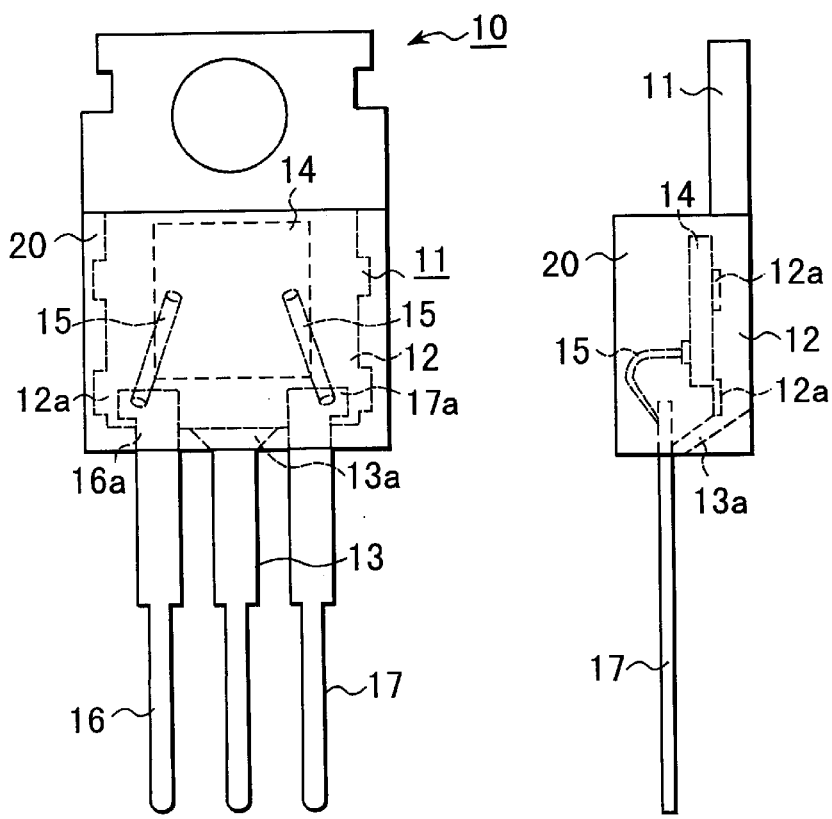
FIGS. 1A and 1B respectively showing a front view and a side view of a semiconductor device according to a first embodiment of the present invention.

FIGS. 1A and 1B show a constitution of a transistor device 10 according to a first embodiment of the present invention. In the transistor device 10, a bed portion 12 of a leadframe 11 formed of a conducting member such as copper having a good conductivity, is exposed from a package 20 in order to efficiently dissipate heat derived from inside the device. The package 20 is integrally molded into one body with the leadframe 11, the bonding wire 15, and a semiconductor element 14. The package 20 is formed by solidifying a sealing resin composition. When it is not necessary to dissipate heat, the bed portion 12 is not necessary to protrude out of the package 20.

The leadframe 11 has the bed portion 12 (flat board) having the semiconductor element mounted thereon and a lead portion 13 protruding from an end of the bed portion 12 in contact therewith. To prevent sliding of the bed portion 12 with the package 20, a mooring portion 12a of an uneven structure is arranged in a longitudinal direction of the leadframe.

The semiconductor element 14 is mounted on the bed portion 12. The semiconductor element 14 is coated with polyimide. Because of the polyimide coating, the moisture resistance of the semiconductor element can be maintained further satisfactorily. Furthermore, since the mechanical strength is reinforced by the polyimide coating, the semiconductor element can be also improved in shock resistance. In addition, the polyimide efficiently mitigates the difference in linear thermal expansion between the leadframe and the resin, and thus, adhesion properties are improved.

Other leads 16, 17 are arranged in parallel to the lead portion 13. The leads 16, 17 are connected, with the bonding wire 15, to terminal portions provided on the semiconductor element 14 via end portions 16a, 17a within the package 20. The bonding wire 15 is formed of a metal having a good conductivity, such as gold and aluminum, and has a thickness of about 200 μm.

The semiconductor sealing composition is a thermoplastic material. The thermosetting material is not substantially contained in the semiconductor sealing composition. The semiconductor sealing composition of the present invention is prepared recyclable to reduce industrial waste. It is preferable that a fibrous filler such as glass fiber be not substantially contained. A particulate filler such as silica may be mixed in some cases, but if the content of the particular filler exceeds 75 wt %, it is sometimes difficult to mix the filler.

To the sealing resin composition constituting the package 20, an adhesion imparting agent is added to increase the adhesion properties. As the adhesion imparting agent, rubbers of a phosphoric acid anhydride series are used. If an acrylic acid/maleic anhydride copolymer having a polar group of —COH is used as the adhesion imparting agent to bind the leadframe formed of Cu or 42 alloy, a H—COOH bonding is produced by interacting with an —OH group present in a surface of the leadframe. As a result, adhesion can be improved. To improve adhesion properties, it is therefore preferable to chose the material having a polar group which is capable of binding to a hydroxyl group present in the surface of the leadframe.

To the sealing resin composition, silica particles are added as the filler. Fillers formed of fine particles are responsible for reducing not only the linear expansion coefficient in absolute value but also anisotropy thereof. The anisotropy of the linear expansion coefficient is greatly related to the adhesion of the resin as will be described later. Among the fillers, silica fine particles are preferably used. In this embodiment, silica is processed into fine particles of about 10 μm or less in diameter and thereafter added to the resin. Examples of the fillers other than silica fine particles include silicate particles, ceramics particles, and mica particles. It is preferable that the filler be inert and have an isotropic shape.

Conventionally, a fiber material has been mixed in a resin to increase the mechanical strength of the semiconductor device. However, a fiber material having an anisotropic outer shape is not added since such a fiber material facilitates anisotropy of the line expansion coefficient. Of the fibers, particularly the glass fiber shortens the life of the semiconductor device, since Na ions and Cl ions melt out from sodium glass components. Furthermore, the sealing resin composition must be mixed when recycled. However, if the glass fiber is mixed in the sealing resin composition, the glass fibers are torn to pieces in the mixed step. As a result, its mechanical strength cannot be maintained.

The sealing resin composition used herein is a resin having a thermoplastic resin called polyphenylene sulfide (PPS) as a thermoplastic component. The package 20 is formed by injection-molding and solidifying a sealing resin composition which has been colored black and rendered opaque. The molding conditions are as follows: a molding temperature: 155° C.; a resin melting temperature: 350° C.; a presumable viscosity (actually not measurable) of the resin passing through a gate provided in a shaping mold: 100 Pa·s; and a holding pressure: 60 MPa. The semiconductor device is formed by electrically connecting the semiconductor element 14 to the leadframe 11 with the bonding wire 15, arranging the bonded construct in a cavity formed in the shaping mold, filling the cavity with the sealing resin composition, and cooling it to solidify.

Now, physical properties of the semiconductor device molded by using the aforementioned sealing resin composition will be described below more specifically. The thermoplastic resin composition having the adhesion imparting agent added thereto is used in the package 20. It is generally known that if the adhesion imparting agent is added, the mechanical strength of the package 20 tends to be decreased. When the mechanical strength is too low, the package 20 is sometimes chipped off when a lead is pulled.

The semiconductor device 10 was subjected to a lead tensile test. The lead tensile test is a test for measuring a tensile strength of a lead. A lead portion is constituted of two parts: a first part (0.5 mm thick×2.0 mm wide×2.5 mm long) close to the element and a second part (0.5 mm thick×1.0 mm wide×18 mm long) extending from the first part.

The lead portion is held by a vise at a portion at a distance of 5 to 6 mm from a distal end (upper end of the lead portion 11 in FIG. 1B) of the first lead part and held at a distance of 10 mm from an end (lower end of the package in FIG. 1A) of the package (19 mm long×4.5 mm thick×15 mm wide) by a vise. Then, the lead portion is pulled at a speed of 10 mm/min by a cross head until the lead is cut or comes out. The tensile strength is measured at the time the lead is cut or comes out. At this time, the lead protrudes at a portion at a distance of 3.0 mm from the bed portion 12 of the package.

Figure 2:
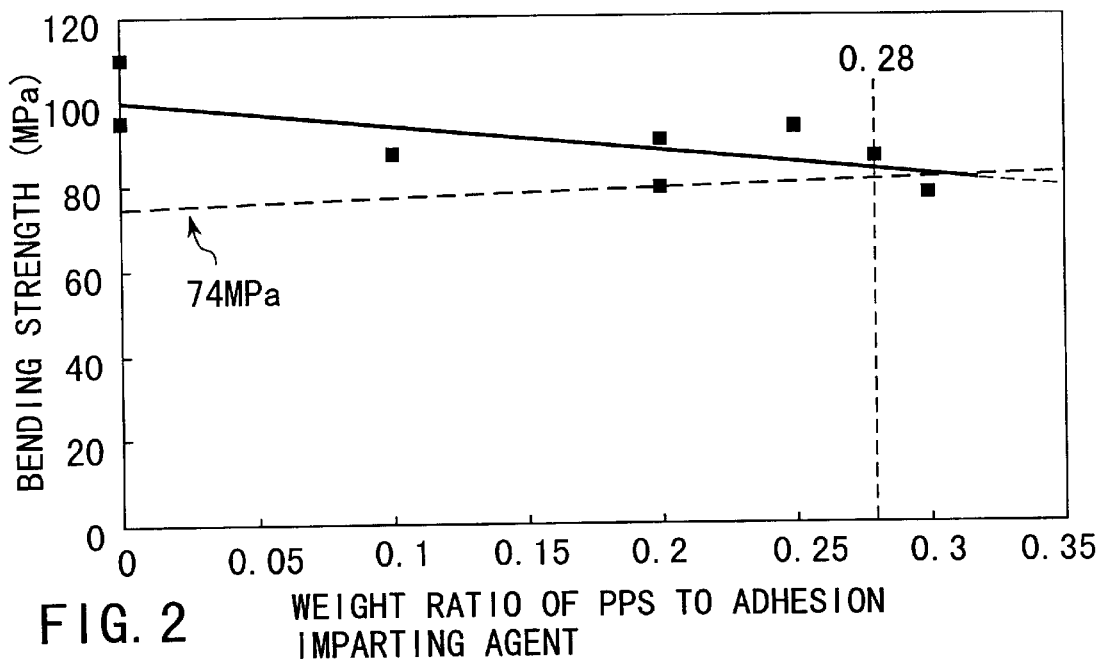
FIG. 2 is a graph showing the bending strength versus a weight ratio of thermoplastic resin PPS (polyphenylene sulfide) to an adhesion properties imparting agent.

The test device is a universal tensile test machine UCT −2.5T manufactured by Orientech Co., Ltd. Of the packages subjected to the tensile test, no chip-off was observed in the packages having a bending strength of 74 MPa or more. Therefore, the adhesion imparting agent may be added up to the amount which gives a bending strength of 74 MPa or more in a generally used semiconductor device. From experiments, the relationship between a weight ratio of the adhesion imparting agent to the thermoplastic resin (the adhesion imparting agent [wt %]/the thermoplastic resin [wt %]) in the sealing resin composition and the mechanical strength of the thermoplastic resin is obtained as shown in FIG. 2. The bending strength is maintained at 74 MPa until the weight ratio does not exceed 0.28 but decreases when the weight ratio exceeds 0.28. Therefore, an upper limit of the weight ratio is about 0.28. In this case, the semiconductor sealing resin composition is constituted of silica particles (65 wt % to 75 wt %) and a thermoplastic resin (25 wt % to 35 wt %). Furthermore, to impart the adhesion properties, the adhesion imparting agent for increasing adhesion to other material by means of a polar group boding, may be added to the thermoplastic resin composition in an amount of about 28 wt % or less based on the thermoplastic resin separately added.

FIG. 3 shows the results obtained when the semiconductor device 10 was subjected to a temperature cycle test (TCT). In the TCT, the semiconductor device is tested for resistance by subjecting it repeatedly to a temperature cycle consisting of −65° C. (30 minutes), room temperature (25° C.: 5 minutes) and 150° C. (30 minutes). In this test, the temperatures are changed abruptly. After a predetermined number of temperature cycles is completed, the electric properties of the semiconductor device are compared to those before the test. If the fluctuation rate of the electric properties exceeds a predetermined value (e.g., 5%) in absolute value, the semiconductor device is determined defective.

Since the resin has a small line expansion coefficient in a low temperature range, the adhesion to the leadframe or to the semiconductor element rarely degrades at a temperature of −65° C. Whereas, the linear expansion coefficient in a high temperature range is larger than that in the low temperature range. As a result, in the case of the sealing resin composition whose line expansion coefficient in the high temperature is set at a predetermined value or more, exfoliation takes place at the interface between the leadframe 11 and the package 20, with the result that the adhesion is sometimes degraded. As explained above, the linear expansion coefficient in the high temperature range, which has an effect upon degradation of adhesion, is a key parameter of the resin constituting the package 20.

FIG. 4 is a graph showing the relationship between temperature and distortion with respect to a thermoplastic resin and a thermosetting resin.

Since a glass transition temperature of the thermoplastic component (PPS) is close to about 90° C., an inflection point of the line expansion coefficient of the sealing resin composition is present near about 90° C.

Therefore, the linear expansion coefficient within a range of 80° C. to 100° C. including the inflection point is not stable but tends to be larger than that of other temperature ranges.

The fact that the line expansion coefficient near the temperature range of 80–100° C. is large, means that stress is given to the element. The stress is measured, for example, in a thermal fatigue test (TFT). In the TFT, electric power is supplied to an element to generate heat from the element. At this time, temperature increases by about 100° C. Assuming that room temperature is 25° C., the temperature can be increased to about 125° C. After the element is kept at the increased temperature for 1 minute, the power supply is terminated and then initiated 3 minutes later.

After a predetermined number of thermal fatigue cycles is completed, electric properties of the element are compared to those before the test. If the fluctuation rate of the electric properties measured at this time exceeds a predetermined value (e.g., 150%) in absolute value, the element is determined defective. In the element determined defective in the TFT, cracks are sometimes produced if stress is repeatedly applied to the element. It is known that the thermal stress produced within the package can be expressed by the following equation:

$$\sigma = \int E \cdot \alpha \, dt$$

where $\sigma$ is stress, $E$ is a bending elasticity coefficient, and $\alpha$ is a line expansion coefficient.

Therefore, the line expansion coefficient near 80° C. to 130° C. and the bending elasticity coefficient have a great effect upon reliability of the semiconductor element.

It is necessary to optimize the line expansion coefficient near 80° C. to 125° C. and the bending elasticity coefficient of the semiconductor element subjecting to the TFT. At the same time, the line expansion coefficient of 150° C. to 200° C. must be optimized for the TCT.

When the semiconductor device molded by using a sealing resin composition having a line expansion coefficient in a high temperature range (150–200° C.) of $6.4 \times 10^{-5}$ [1/°C.] or less in absolute value, was subjected to the TCT on the basis of the aforementioned discussion, it was found that the semiconductor device using a resin having a line thermal coefficient of $4.75 \times 10^{-5}$ [1/°C.] in absolute value tends to produce a defect, as shown in FIG. 3. It was confirmed, by conducting experiments, that a defect is not produced when a sealing resin composition having a line thermal expansion coefficient of $2.5 \times 10^{-5}$ [1/°C.] or more, is used.

Table 1 shows the results of the TCT for a plurality of samples prepared by varying a weight ratio of the adhesion imparting agent to PPS to be added to the semiconductor sealing resin composition. The TCT is performed in accordance with the standard of JIS C 7021: A-4 or JIS C 7022: A-4. Each of samples (lot) has ten identical products. Electric properties for each sample are measured every 100 cycles up to 300 cycles. If the fluctuation rate of the electric properties exceeds of 5% in absolute value, the sample is determined defective. Actually, seven samples were prepared by varying amounts of the silica fine particles and the adhesion imparting agent and subjected to the test. For each of seven samples, two molded products are prepared; one is Group A which is prepared by placing a semiconductor element (3.8 mm×3.8 mm) on a leadframe and unifying them with a sealing resin composition. The other is Group B which is prepared by placing a semiconductor element (6.5 mm×6.5 mm) on a leadframe and unifying them with the sealing resin composition.

TABLE 1

Thermal cycle test results for electric properties of semiconductor device package

| | Composition [wt %] | | | | Properties | | | |
| --- | --- | --- | --- | --- | --- | --- | --- | --- |
| | | | | | Line thermal expansion coefficient × $10^{-5}$ [1/° C.] | | | |
| Sample No. | Silica | PPS | Adhesion imparting agent | Glass fiber | Flow direction ($\alpha$) | Normal direction ($\beta$) | Coefficient ratio ($\alpha/\beta$) | Bending strength [Mpa] |
| 1 | 30 | 35 | 5 | 30 | 1.3 | 6.1 | 0.21 | 141.0 |
| 2 | 30 | 40 | 0 | 30 | 1.9 | 6.7 | 0.28 | 180.0 |
| 3 | 75 | 25 | 0 | 0 | 2.5 | 3.1 | 0.81 | 87.4 |
| 4 | 69 | 28 | 3 | 0 | 2.8 | 4.5 | 0.62 | 87.4 |

TABLE 1-continued

Thermal cycle test results for electric properties of semiconductor device package

| 5 | 70 | 25   | 5   | 0 | 2.7 | 3.5 | 0.77 | 95.0 |
| 6 | 70 | 25   | 5   | 0 | 2.7 | 4.3 | 0.53 | 74.0 |
| 7 | 75 | 19.5 | 5.5 | 0 | 2.5 | 4.5 | 0.55 | 80.0 |

| | TCT [Defective products/test products] | | | | | |
|---|---|---|---|---|---|---|
| Sample | 100 [cycle] | | 200 [cycle] | | 300 [cycle] | |
| No. | Group A | Group B | Group A | Group B | Group A | Group B |
| 1 | 10/10 | 10/10 | — | — | — | — |
| 2 | 3/10 | 7/10 | 10/10 | 10/10 | — | — |
| 3 | 0/10 | 0/10 | 0/10 | 0/10 | 0/10 | 0/10 |
| 4 | 0/10 | 0/10 | 0/10 | 0/10 | 0/10 | 0/10 |
| 5 | 0/10 | 0/10 | 0/10 | 0/10 | 0/10 | 0/10 |
| 6 | 0/10 | 0/10 | 0/10 | 0/10 | 0/10 | 0/10 |
| 7 | 0/10 | 0/10 | 0/10 | 0/10 | 0/10 | 0/10 |

In Table 1, the larger the size of the semiconductor device, the larger the percent defective. Therefore, it is clear that adhesion properties of Sample 1 and Sample 2 are extremely low. However, although there is no change of the adhesion imparting agent in addition amount, percent defective in Group B is larger than in Group A in Sample 2. No defects are produced in other samples.

Furthermore, line expansion coefficients of individual samples were measured. The results are listed in Table 1. After repeating the experiment, it is confirmed that no defects are produced in a sample having a ratio $\alpha/\beta$ (hereinafter, referred to a coefficient ratio) of 0.55 or more, where $\alpha$ is a line expansion coefficient in a flow direction of a resin, and $\beta$ is a line expansion coefficient in the normal direction which is perpendicular to the flow direction. In this embodiment, the confirmation is made by using a parameter, $\alpha/\beta$. However, when the confirmation is made by using a parameter, $\alpha/\beta$, the same effect can be obtained in the sample having a $\beta/\alpha$ ratio of 1.82 or less. The closer both ratios become to 1, the better.

The thermoplastic sealing resin compositions listed in table 1 contain silica in an amount of 30 to 75 wt %. However, silica may not be contained. The samples are listed in Table 1 just only for comparison. However, if silica is added in excess of 75%, the resin composition is sometimes too hard to mix.

In general, a filler is added to improve a mechanical strength of the package. This is readable from Table 1. The mechanical strength improving effect is larger in a fibrous filler such as a glass fiber than in a granular filler. Therefore, the amount of silica is suppressed in Samples 1 and 2. The line expansion coefficient is low in Samples 1 and 2 containing a silica in an amount of 30 wt %. However, in Sample 7 containing silica in an amount of 75 wt %, the line expansion coefficient is low compared to other samples. From this fact, it is found that the content of silica does not have a direct effect upon an increase in line expansion coefficient ratio of the material. In contrast, it is readable from Table 1 that the glass fiber has a direct effect upon the line expansion coefficient ratio.

Furthermore, silica itself does not have a viscosity and a resin has a viscosity but slight. Therefore, a glass fiber is added to increase the bending strength of the package. In this case, it is not easy for the package to deform in accordance with the deformation of the leadframe when it expands or contracts. In Samples 1 and 2, PPS is added in a larger amount than in other samples to improve the viscosity. In the case where silica is added in a larger amount or where PPS is added in a smaller amount than in Sample 1, percent defective increases in a test. If the fluctuation rate of the electric properties exceeds 5% in absolute value, the sample is determined defective. PCT (Pressure Cooker Test) is performed in accordance with EIAJ SD-121: 18 or EIAJ 1C-121:18.

TABLE 2

Thermal cycle test results for electric properties of semiconductor device package

| | Composition [wt %] | | | | Properties | | | | | | |
|---|---|---|---|---|---|---|---|---|---|---|---|
| | | | | | Line thermal expansion | | | | | | |
| | | | Adhesion | | coefficient $\times 10E^{-5}$ (1/° C.) | | | | | | Bending |
| Sample | | | imparting | Glass | 80 to 130° C. | | | 150 to 200° C. | | | strength |
| No. | Silica | PPS | agent | fiber | $\alpha$ | $\beta$ | $\alpha/\beta$ | $\alpha$ | $\beta$ | $\alpha/\beta$ | Mpa |
| 1 | 75 | 35   | 0   | 0 | 3.0 | 3.3 | 0.90 | 2.5 | 3.1 | 0.81 | 87.4 |
| 2 | 69 | 28   | 3   | 0 | 6.1 | 6.3 | 0.97 | 2.8 | 4.5 | 0.62 | 87.4 |
| 3 | 70 | 25   | 5   | 0 | 5.3 | 5.7 | 0.93 | 2.7 | 3.5 | 0.77 | 95.0 |
| 4 | 70 | 25   | 5   | 0 | 6.3 | 6.7 | 0.94 | 2.7 | 4.3 | 0.63 | 74.0 |
| 5 | 75 | 19.5 | 5.5 | 0 | 3.1 | 3.1 | 1.00 | 2.5 | 4.5 | 0.55 | 80.0 |
| 6 | 65 | 29   | 3   | 0 | 6.1 | 6.2 | 0.98 | 3.5 | 4.5 | 0.78 | 83.0 |

TABLE 2-continued

Thermal cycle test results for electric properties of semiconductor device package

| 7 | 68 | 26 | 6 | 0 | 5.7 | 5.8 | 0.98 | 3.3 | 4.6 | 0.67 | 77.0 |
| 8 | 68 | 29 | 3 | 0 | 3.4 | 3.5 | 0.97 | 2.3 | 3.5 | 0.66 | 87.5 |

| Sample No. | TCT 300 cyc | | TFT 3000 cyc | | TFT 5000 cyc | |
| --- | --- | --- | --- | --- | --- | --- |
| | A | B | A | B | A | B |
| 1 | 0/10 | 0/10 | 0/10 | 0/10 | 0/10 | 0/10 |
| 2 | 0/10 | 0/10 | 4/10 | 0/10 | 8/10 | 1/10 |
| 3 | 0/10 | 0/10 | 0/10 | 0/10 | 0/10 | 0/10 |
| 4 | 0/10 | 0/10 | 5/10 | 1/10 | 9/10 | 3/10 |
| 5 | 0/10 | 0/10 | 0/10 | 0/10 | 0/10 | 0/10 |
| 6 | 0/10 | 0/10 | 8/10 | 2/10 | 9/10 | 5/10 |
| 7 | 0/10 | 0/10 | 0/10 | 0/10 | 0/10 | 0/10 |
| 8 | 0/10 | 0/10 | 0/10 | 0/10 | 0/10 | 0/10 |

Table 2 shows the results of the TCT and TFT using a plurality of samples varied in a weight ratio of PPS to the adhesion imparting agent to be added to a semiconductor sealing resin composition. The TFT is performed in accordance with the standards JISC 7021: B-6 and JISC 7022: B-2. Each of samples (one lot) has ten identical products.

Electrical properties of each sample are measured every 1000 cycles up to 10000 cycles. If the fluctuation rate of the electrical properties exceeds 50% in absolute value, the sample is determined defective. Actually, eight samples were prepared by varying amounts of the silica fine particles and the adhesion imparting agent and subjected to tests.

For each of eight samples, two molded products, Group A and Group B are prepared. Group A is prepared by mounting a semiconductor element (3.8 mm×3.8 mm) on a leadframe and unifying them with a sealing resin composition. Group B is prepared by mounting a semiconductor element (6.5 mm×6.5 mm) on a leadframe and unifying them with the sealing resin composition.

In table 3, if the line expansion coefficient within a temperature range of 80° C.–130° C. exceeds $6.0 \times 10^{-5}$ [1/°C.], the number of defective products increases in the TFT.

TABLE 3

Thermal cycle test results for electric properties of semiconductor device package

| Sample No. | Composition [wt %] | | | | Line thermal expansion coefficient × $10E^{-5}$ (1/° C.) | | | | | | Bending strength Mpa | Elasticity coefficient Gpa | Stress value (Mpa) $\sigma = \int E \cdot \alpha dt$ |
| --- | --- | --- | --- | --- | --- | --- | --- | --- | --- | --- | --- | --- | --- |
| | Silica | PPS | Adhesion imparting Agent | Glass fiber | 80 to 130° C. | | | 150 to 200° C. | | | | | |
| | | | | | α | β | α/β | α | β | α/β | | | |
| 1 | 75 | 25 | 0 | 0 | 3.0 | 3.3 | 0.90 | 2.5 | 3.1 | 0.81 | 87.4 | 9.7 | 25.04 |
| 2 | 70 | 25 | 5 | 0 | 5.3 | 5.7 | 0.93 | 2.7 | 3.5 | 0.77 | 95.0 | 8.2 | 30.05 |
| 3 | 75 | 19.5 | 5.5 | 0 | 3.1 | 3.1 | 1.00 | 2.5 | 4.5 | 0.55 | 80.0 | 9.0 | 22.46 |
| 4 | 68 | 26 | 6 | 0 | 5.7 | 5.8 | 0.98 | 3.3 | 4.6 | 0.67 | 77.0 | 6.4 | 23.98 |
| 5 | 68 | 29 | 3 | 0 | 3.4 | 3.5 | 0.97 | 2.3 | 3.5 | 0.66 | 87.5 | 9.2 | 24.49 |

| Sample No. | PCT 500(H) | | TCT 1000 cyc | | TFT 10,000 cyc | | TFT 15,000 cyc | |
| --- | --- | --- | --- | --- | --- | --- | --- | --- |
| | A | B | A | B | A | B | A | B |
| 1 | 1/10 | 1/10 | 0/10 | 0/10 | 0/10 | 0/10 | 1/10 | 0/10 |
| 2 | 0/10 | 0/10 | 0/10 | 0/10 | 0/10 | 0/10 | 5/10 | 2/10 |
| 3 | 0/10 | 0/10 | 0/10 | 0/10 | 0/10 | 0/10 | 0/10 | 0/10 |
| 4 | 0/10 | 0/10 | 0/10 | 0/10 | 0/10 | 0/10 | 0/10 | 0/10 |
| 5 | 0/10 | 0/10 | 0/10 | 0/10 | 0/10 | 0/10 | 0/10 | 0/10 |

From Table 3, it is demonstrated not only that the conditions obtained the studies in the above are proper but also that long-term reliability is relatively low without the adhesion imparting agent.

Table 3 includes also the results in the case where TFT is performed up to 15000 cycles. Furthermore, Table 3 includes calculation values for bending elasticity and thermal stress σ generated in the package. As shown in Table 3, cracks are generated in the elements of Group A using a resin which has a thermal stress σ of 25 MPa or more, with the result that the element is determined defective.

It is preferable, from the view point of moisture resistance, that the resin to be used in a semiconductor device should have a line expansion coefficient of $4.75 \times 10^{-5}$ [1/°C.] or less in a temperature range of 150 to 200° C.

It is preferable, from the view point of crack generation in the element, that the resin to be used in a semiconductor device having a thermal stress measurable by the TFT should have a line expansion coefficient of $6.0 \times 10^{-5}$ [1/°C.] or less when the glass transition temperature falls within a range of 80° C. to 130° C.

Furthermore, when the resin having a thermal stress σ of 25 MPa or less is subjected to the TFT up to 15000 cycles, no cracks are generated in the semiconductor elements of Groups A and B.

Furthermore, it is demonstrated that the thermal expansion coefficient of the sealing resin composition is preferably 0.55 or more. The thermal expansion coefficient may exceed 1.0 but may be better if it is closer to 1.0. Therefore, it is desirable that the fiber material which has been conventionally added to the resin to reinforce the mechanical strength of the semiconductor device, should not be added.

To impart long-term reliability of moisture resistance so as not to cause a problem in mechanical strength, it was confirmed that the adhesion imparting agent is preferably added to the resin material up to 0.28 parts. It is therefore possible to obtain a resin having a bending strength of 74 MPa or more. The resin thus obtained is suitable for manufacturing a semiconductor device.

<Second Embodiment>

Figure 5:
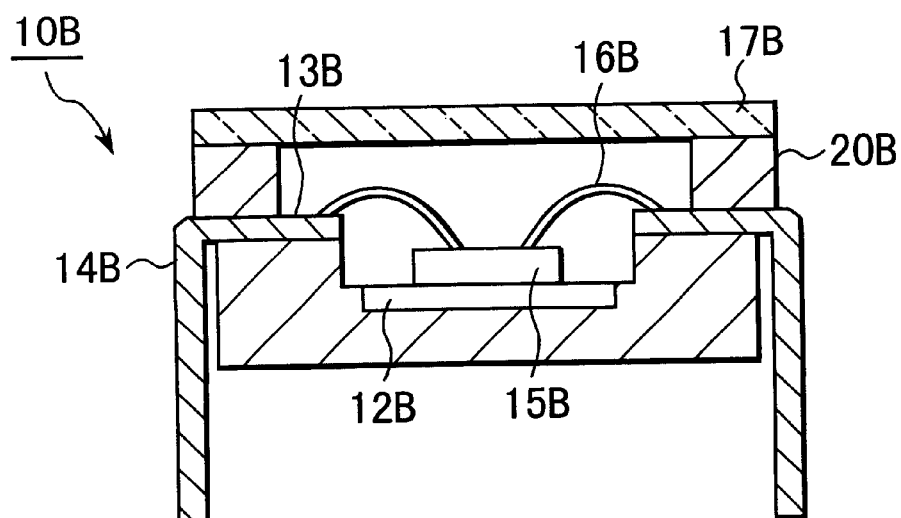
FIG. 5 is a cross-sectional view of a semiconductor device according to a second embodiment of the present invention.

FIG. 5 shows a structure of a charge coupled device (CCD) 10B according to a second embodiment of the present invention.

In the CCD device 10B, a CCD element 15B (1.8 mm×3.0 mm) is placed in a hollow space (free space) of a hollow package 20B made of a sealing resin composition. A light receiving surface of the CCD element 15B is constituted of optical glass 17B and exposed to the free space, whereas no light receiving surface is bonded to a bed portion 12B of a leadframe and closed.

The lead is held by the hollow package 20B. An inner lead portion 13B and the CCD element 15B are electrically connected to each other with a bonding wire 16B of about 25 μm in diameter. The bonding wire is formed of a good conductive material such as gold or aluminum. The outer lead portion 14B, which is placed outside the hollow package 20B, is provided for electrically connecting another device to the CCD element 15B.

The hollow package 20B is formed by an injection molding of a sealing resin composition colored black and rendered opaque. The molding conditions are: a mold temperature: 155° C., a resin melting temperature: 340° C., a presumable viscosity (actually not measurable) of a resin passing through the gate provided in the shaping mold: 300 Pa·s, and a holding pressure: 120 MPa.

Based on the aforementioned reasons, the physical properties of the resin forming the hollow package 20B are set as follows. The line expansion coefficient is set at $4.75 \times 10^{-5}$ [1/°C.] or less in a high temperature range of 150° C. to 200° C. The ratio of the line expansion coefficient of the sealing resin composition is set at 0.55 or more. Furthermore, to ensure long-term reliability of moisture resistance so as not to produce a problem with mechanical strength, the adhesion imparting agent is added up to 0.28 parts by weight to the resin. The thermoplastic resin thus obtained has a bending strength of 74 [MPa] or more. A fiber material usually added to reinforce the mechanical strength of a semiconductor device is not added to this resin.

TABLE 4

Thermal cycle test results for electric properties of semiconductor device package

| | Composition [wt %] | | | | Line thermal expansion coefficient × $10^{-5}$ [1/° C.] | | | |
|---|---|---|---|---|---|---|---|---|
| Sample No. | Silica | PPS | Adhesion imparting agent | Glass fiber | Flow direction (α) | Normal direction (β) | Coefficient ratio (α/β) | Bending strength [Mpa] |
| 1 | 70 | 30 | 0 | 0 | 2.9 | 4.7 | 0.52 | 110.1 |
| 2 | 69 | 28 | 3 | 0 | 2.8 | 4.5 | 0.62 | 85.0 |
| 3 | 75 | 20 | 5 | 0 | 2.5 | 3.1 | 0.81 | 87.4 |
| 4 | 70 | 25 | 5 | 0 | 2.6 | 4.5 | 0.58 | 85.6 |
| 5 | 70 | 25 | 5 | 0 | 3.3 | 5.5 | 0.60 | 74.0 |
| 6 | 75 | 19.5 | 5.5 | 0 | 2.5 | 4.5 | 0.55 | 80.0 |

| Sample No. | TCT [Defective products/test products] 150 [cycle] | HTB (60° C.: 90%) 150 [H] | HTB 400 [H] |
|---|---|---|---|
| 1 | 1/3 | X | — |
| 2 | 0/3 | ○ | ○ |
| 3 | 0/3 | ○ | ○ |
| 4 | 0/3 | ○ | ○ |
| 5 | 2/3 | ○ | ○ |
| 6 | 0/3 | ○ | ○ |

Six types of CCD devices (three devices for each) using the sealing resin composition varied in addition amount of the adhesion imparting agent, are subjected to the TCT and a high-temperature and high-moisture stand-still test. The results are shown in Table 4.

In the TCT, one cycle is constituted of −65° C. (30 minutes) and 150° C. (30 minutes). After 150 cycles, electric properties of each sample are measured. If the fluctuation rate of the electric properties exceeds 5% in absolute value, the device are determined defective. The high temperature and high moisture stand-still test is performed by allowing the sample to stand in a furnace heated at 60° C. and having a moisture of 90% and determining condensation generated within the sample under visual observation. At time points of 150 h and 400 h after initiation of the stand-still test, whether the condensation occurs or not is visually observed for each. If the condensation within the sample is not observed, adhesion properties are determined as "good (○)". Conversely, if the condensation is observed, the adhesion properties are not good (X).

From Table 4, it is confirmed that the conditions obtained from the aforementioned studies are proper. In addition, it is again confirmed that, in the case where the sealing resin composition is exposed to excessively severe conditions for a long time, it is difficult to maintain moisture resistance if the adhesion imparting agent is not added to the sealing resin composition.

<Third Embodiment>

Figure 6:
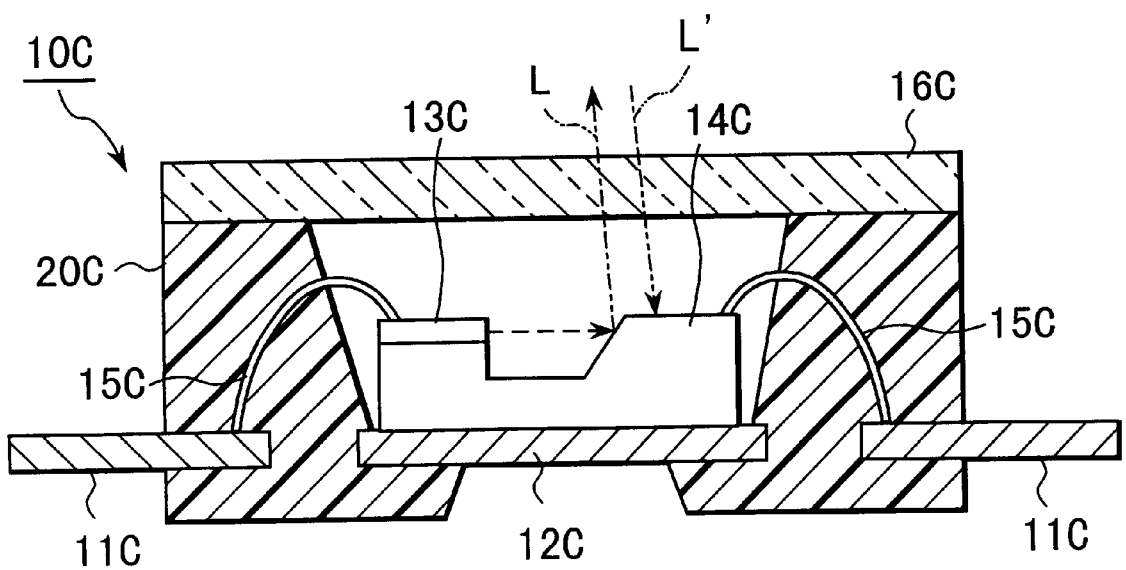
FIG. 6 is a cross-sectional view of a semiconductor device according to a third embodiment of the present invention.

FIG. 6 shows an integrated optical unit (IOU) 10C according to a third embodiment of the present invention.

In the IOU 10C, a semiconductor laser 13C and a photodetector 14C are mounted on the bed portion 12C made of copper and this construct is placed in a hollow space of a hollow package 20C made of the resin material of the present invention using PPS as the thermoplastic resin. The semiconductor laser 13C (0.3 mm×0.8 mm) emits laser light L. The photodetector 14C (3.8 mm×6.0 mm) receives reflection light L' which is a reflection light of the laser light L, modulated by a recording medium such as an optical disk. Optical glass is arranged in an output/input port for the light L, L'. An integrated circuit (IC) may be arranged on the bed portion 12C. A lead 11C is provided outside the hollow package with an end thereof partially buried, for conducting electric current from the outside into the inside. The partially buried portion is electrically connected to the elements arranged on the bed portion 12C with a bonding wire 15C. The bonding wire 15C is formed of a metal and having a diameter of about 25 μm.

The sealing resin composition constituting the hollow package 20C is colored black and rendered the resin opaque in order that light introduced from the outside does not disturb operations of the elements mounted on the bed portion 12C. The molding conditions are as follows: a mold temperature: 155° C., a resin melting temperature: 340° C., a presumable viscosity (actually not measurable) of a resin passing through the gate provided in the shaping mold: 300 Pa·s, and a holding pressure: 120 MPa.

Based on the aforementioned reasons, the physical properties of the resin forming the hollow package 20C are set as follows. The line expansion coefficient is set at $4.75\times10^{-5}$ [1/°C.] or less in a high temperature region of 150° C. to 200° C. The ratio of the line expansion coefficient of the sealing resin composition is set at 0.55 or more. Furthermore, to ensure long-term reliability of moisture resistance so as not to produce a problem with mechanical strength, the adhesion imparting agent is added to the resin in an amount of up to 0.28 parts by weight. The thermoplastic resin thus obtained has a bending strength of 74 MPa or more. A fiber material which has been conventionally added to reinforce the mechanical strength of a semiconductor device, is not added to this resin.

The IOC 10C is applied to a luminescent unit of a light head device to be mounted in an optical disk device. Since the resin package is excellent in productivity in view of cost and manufacturing speed compared to a metal package, it is possible to contribute to improvement of productivity of an applied product such as an optical head device to be mounted on an optical disk device for reproducing an optical disk or recording with a laser light.

The present invention is not limited to the embodiments mentioned above. For example, PPS is used as the thermoplastic resin. However, the same properties can be obtained by using another resin composition mainly containing a thermoplastic resin such as LCP (liquid crystal polymer), PEEK (Polyether etherketone), PEN (polyether nitrile), or PES (polyether sulfone).

The semiconductor element of the present invention is applicable to all uses including calculation, illumination, receiving light, amplification, and memory.

The adhesion imparting agent is added to the resin to improve adhesion properties to other material. However, it is sometimes not necessary to contain the adhesion imparting agent in the package of the semiconductor device which is installed in electric appliances having a short life cycle, such as a personal computer, calculator, watch, and thermometer. In these cases, if the adhesion imparting agent is not added, a predetermined operation and reliability can be ensured. On the other hand, in the case of devices such as power electronics which are used in severe conditions, it is preferable to use a resin having the adhesion imparting agent added thereto.

The resin used herein has a bending strength of 74 MPa or more. However, in some cases, a thermoplastic resin not satisfying this range may be used in consideration of usage, the product life and implementation environment. In this case, as long as a line expansion coefficient ratio between the flow direction and the normal direction of the flow direction is at least 0.55, the thermoplastic resin can be applied to a semiconductor device.

The leadframe is shown as an example of the conductive material. A flip-chip contact with a solder ball may be used. According to the present invention, a resin composition having a line expansion coefficient of $4.5\times10^{-5}$ [1/°C.] or less within a temperature range of 150° C.–200° C. or a resin composition having a line expansion coefficient of the flow direction to the normal direction of 0.55 or more, or a resin composition consisting of silica particles (69 wt % to 75 wt %) and a thermoplastic resin (25 wt % to 31 wt %) is used for sealing a semiconductor. Therefore, it is possible to manufacture a semiconductor device high in moisture resistance.

Furthermore, according to the present invention, the thermoplastic resin used herein contains the adhesion imparting agent improving in adhesion of a resin to another material in an amount of 0.28 parts or less or has a bending strength of 74 MPa or more. It is therefore suitable for manufacturing a semiconductor device high in moisture resistance while the mechanical strength is maintained relatively high.

According to the present invention, since the resin containing silica fine particles of 10 μm or less in diameter have a line expansion coefficient ratio close to 1.0 in addition to the aforementioned feature, it is suitable for manufacturing a semiconductor device high in moisture resistance.

If the resin is adopted to the conditions of the present invention as a whole, a predetermined effect can be obtained even though a thermosetting resin and a fibrous material are added to the resin. In other words, the thermosetting resin may be added as long as the addition of the thermosetting resin does not change the thermoplastic properties of the sealing resin composition of the present invention into the thermosetting properties. In addition, the fibrous material may be added as long as a linear expansion coefficient ratio between in the flow direction and in the normal direction of the sealing resin of the present invention falls within the range of the present invention by the addition of the fibrous material.

Furthermore, according to the present invention, a semiconductor element and a conducting material are sealed with the thermoplastic resin. It is therefore possible to provide a recyclable semiconductor device while the moisture resistance and the mechanical strength are maintained satisfactorily.

In this text, when the reliability is evaluated, the electrical properties are measured using a current value Iceo (a reverse current between a collector and an emitter when the base is opened) as an index in the case of a transistor. However, it is known that voltage parameters such as Vcbo (collector-base reverse current when an emitter is opened), Vceo (collector-emitter reverse voltage when the base is opened) and Vebo (emitter-base reverse voltage when the collector is opened) are much more influenced by the TCT test. Requirements for the sealing resin composition appear to be severe if the measurement is performed on the basis of the voltage parameters. Conversely, if the measurement is performed using the electric properties less influenced by the test, as a parameter, the requirement for the sealing resin composition becomes less severe.

The bending strength of the sealing resin composition is measured in accordance with the JIS standard K-7171. More specifically, a test piece of 127 mm long×12.6 mm wide×3.2 mm thick is prepared by inject-molding and allowing it to stand still in an ambient of a temperature of 23° C. and a moisture of 50%Rh for one day. The bending strength of the test piece was measured in the same ambient of 23° C. and 50% Rh by using a test machine ABM/RTA-500 manufactured by Orientech Co., Ltd., under the conditions: an indentater radium of 5 mm, a fulcrum distance of 50 mm, and a test speed of 20 mm/min. The longitudinal direction of the injection molded product corresponds to the resin flow direction. The bending strength is measured by pressing a center portion of the molded product while both ends thereof in the flow direction are freely held.

In this text, the line expansion coefficient of the sealing resin composition is measured on the basis of the JIS standard K-7197. More specifically, a test piece of 7 mm×12 mm×3.2 mm is first excised from a position at a distance of 80 mm from the gate portion of a molding device used when the bending strength is measured. The bending strength of the test piece is measured in an atmosphere by using a stress/distortion measuring apparatus TMA-120C (manufactured by Seiko Instruments Inc.) having a quartz rod of 2.5–3.0 mm diameter as a detection rod. It is not necessary to correct the temperature. The length is corrected by using an aluminum column (5 mm diameter×10 mm in length). As the line expansion coefficient, an average value of arbitrarily chosen three samples is employed.

Note that the present invention is not limited to embodiments mentioned above and may be modified and carried out in various ways within the gist of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor element;
   a semiconductor sealing resin composition formed of thermoplastic resin and used for sealing the semiconductor element; and
   a conducting material electrically connected to the semiconductor element one end of which is sealed with the semiconductor sealing resin composition;
   wherein the semiconductor sealing resin composition has thermoplastic properties and a thermal expansion coefficient of the semiconductor sealing resin composition is retained between $6.0 \times 10^{-5}$ [1/°C.] and $2.5 \times 10^{-5}$ [1/°C.] at a temperature of 80 to 130° C. and $4.75 \times 10^{-5}$ [1/°C.] or less at a temperature of 150 to 200° C.; and
   wherein a line expansion coefficient ratio between a flow direction and a normal direction of the flow direction is 0.55 or more.

2. The semiconductor device of claim 1, wherein a bending strength of the semiconductor sealing resin composition after solidification is 74 MPa or more.

3. The semiconductor device of claim 1, wherein an adhesion imparting agent is added to the semiconductor sealing composition to improve adhesion properties to another material by binding with a polar group.

4. The semiconductor device of claim 1, wherein the semiconductor sealing resin composition contains silica particles.

5. The semiconductor device of claim 1, wherein the semiconductor sealing resin composition contains a fibrous material.

6. The semiconductor device of claim 1, wherein the semiconductor sealing resin composition contains a thermosetting material.

7. The semiconductor device of claim 1, wherein the semiconductor element is coated with polyimide.

8. The semiconductor device of claim 1, wherein the semiconductor sealing resin composition is thermoplastic and a product obtained by multiplying a sum of a line expansion coefficient at 25 to 80° C. after solidification and a line expansion coefficient at 80–125° C. after solidification, by a bending strength is 25 MPa or less.

9. A semiconductor device comprising:
   a semiconductor element;
   a semiconductor sealing resin composition formed of polyphenylene sulfide and used for sealing the semiconductor element; and
   a conducting material electrically connected to the semiconductor element one end of which is sealed with the semiconductor sealing resin composition;
   wherein the semiconductor sealing resin composition has thermoplastic properties and a thermal expansion coefficient of the semiconductor sealing resin composition is retained between $6.0 \times 10^{-5}$ [1/°C.] and $2.5 \times 10^{-5}$ [1/°C.] at a temperature of 80 to 130° C. and $4.75 \times 10^{-5}$ [1/°C.] or less at a temperature of 150 to 200° C.; and
   wherein a line expansion coefficient ratio between a flow direction and a normal direction of the flow direction is 0.55 or more.

10. The semiconductor device of claim 9, wherein a bending strength of the semiconductor sealing resin composition after solidification is 74 MPa or more.

11. The semiconductor device of claim 9, wherein an adhesion imparting agent is added to the semiconductor sealing composition to improve adhesion properties to another material by binding with a polar group.

12. The semiconductor device of claim 9, wherein the semiconductor sealing resin composition contains silica particles.

13. The semiconductor device of claim 9, wherein the semiconductor sealing resin composition contains a fibrous material.

14. The semiconductor device of claim 9, wherein the semiconductor sealing resin composition contains a thermosetting material.

15. The semiconductor device of claim 9, wherein the semiconductor element is coated with polyimide.

16. The semiconductor device of claim 9, wherein the semiconductor sealing resin composition is thermoplastic and a product obtained by multiplying a sum of a line expansion coefficient at 25 to 80° C. after solidification and a line expansion coefficient at 80–125° C. after solidification, by a bending strength is 25 MPa or less.

17. A semiconductor device comprising:

a semiconductor element;

a semiconductor sealing resin composition formed of liquid crystal polymer and used for sealing the semiconductor element; and a conducting material electrically connected to the semiconductor element one end of which is sealed with the semiconductor sealing resin composition;

wherein the semiconductor sealing resin composition has thermoplastic properties and a thermal expansion coefficient of the semiconductor sealing resin composition is retained between $6.0 \times 10^{-5}$ [1/°C.] and $2.5 \times 10^{-5}$ [1/°C.] at a temperature of 80 to 130° C. and $4.75 \times 10^{-5}$ [1/°C.] or less at a temperature of 150 to 200° C.; and wherein a line expansion coefficient ratio between a flow direction and a normal direction of the flow direction is 0.55 or more.

18. The semiconductor device of claim 17, wherein a bending strength of the semiconductor sealing resin composition after solidification is 74 MPa or more.

19. The semiconductor device of claim 17, wherein an adhesion imparting agent is added to the semiconductor sealing composition to improve adhesion properties to another material by binding with a polar group.

20. The semiconductor device of claim 17, wherein the semiconductor sealing resin composition contains silica particles.

21. The semiconductor device of claim 17, wherein the semiconductor sealing resin composition contains a fibrous material.

22. The semiconductor device of claim 17, wherein the semiconductor sealing resin composition contains a thermosetting material.

23. The semiconductor device of claim 17, wherein the semiconductor element is coated with polyimide.

24. The semiconductor device of claim 17, wherein the semiconductor sealing resin composition is thermoplastic and a product obtained by multiplying a sum of a line expansion coefficient at 25 to 80° C. after solidification and a line expansion coefficient at 80–125° C. after solidification, by a bending strength is 25 MPa or less.

* * * * *